(12) United States Patent
Yatsuda et al.

(10) Patent No.: US 7,932,523 B2
(45) Date of Patent: Apr. 26, 2011

(54) LED LAMP FOR LIGHT SOURCE OF LIGHTING DEVICE

(75) Inventors: Yasushi Yatsuda, Tokyo (JP); Teruo Koike, Tokyo (JP); Ryotaro Owada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 32 days.

(21) Appl. No.: 11/187,841

(22) Filed: Jul. 25, 2005

(65) Prior Publication Data
US 2006/0022211 A1  Feb. 2, 2006

(30) Foreign Application Priority Data

Jul. 30, 2004 (JP) ................................. 2004-223707

(51) Int. Cl.
*H01L 33/00* (2010.01)
(52) U.S. Cl. .............. 257/88; 257/79; 257/98; 257/100; 257/E33.056; 438/28; 438/29; 362/516; 362/545
(58) Field of Classification Search .................... 257/88, 257/E33.056, 79, 98, 100; 438/22, 26–29; 313/500; 315/82; 362/516, 545
See application file for complete search history.

(56) References Cited

U.S. PATENT DOCUMENTS

| 4,011,575 | A  | * | 3/1977  | Groves ............................. 257/91 |
| 6,066,861 | A  |   | 5/2000  | Hohn et al. ..................... 257/99 |
| 6,204,523 | B1 | * | 3/2001  | Carey et al. ..................... 257/98 |
| 6,245,259 | B1 |   | 6/2001  | Hohn et al. ............... 252/301.36 |
| 6,277,301 | B1 |   | 8/2001  | Hohn et al. ............... 252/301.36 |
| 6,576,930 | B2 |   | 6/2003  | Reeh et al. ....................... 257/98 |
| 6,592,780 | B2 |   | 7/2003  | Hohn et al. ............... 252/301.36 |
| 6,613,247 | B1 |   | 9/2003  | Hohn et al. ............... 252/301.36 |
| 6,669,866 | B1 |   | 12/2003 | Kummer et al. ........ 252/301.4 R |
| 6,727,167 | B2 | * | 4/2004  | Gottfried ....................... 438/602 |
| 6,774,401 | B2 |   | 8/2004  | Nakada et al. .................. 257/82 |
| 6,809,342 | B2 |   | 10/2004 | Harada ............................ 257/79 |
| 6,812,500 | B2 |   | 11/2004 | Reeh et al. ....................... 257/98 |
| 7,048,412 | B2 |   | 5/2006  | Martin et al. |
| 7,070,301 | B2 | * | 7/2006  | Magarill ....................... 362/241 |

(Continued)

FOREIGN PATENT DOCUMENTS

JP   8-83869 A   3/1996

(Continued)

OTHER PUBLICATIONS

Japanese Office Action for Japanese Patent Application No. 2004-223707 dated Jun. 9, 2009.

(Continued)

*Primary Examiner* — Matthew E Warren
*Assistant Examiner* — John Lin
(74) *Attorney, Agent, or Firm* — Kenealy Vaidya LLP

(57) ABSTRACT

An LED lamp can be used as a light source of a lighting device. The LED lamp can be combined with a reflecting mirror formed as a paraboloid of revolution, to obtain desired light distribution characteristics, as with a conventional light source. The emission surface of the LED lamp for the light source of the lighting device can be rectangular, and the ratio between a short side and a long side thereof is set in a range of 1:2 to 1:6. Therefore, it is possible to form a light distribution pattern similar to that of a filament, which is conventionally used as an emission source. It is also possible to use almost all light emitted from the LED lamp as illumination light.

17 Claims, 4 Drawing Sheets

U.S. PATENT DOCUMENTS

| | | |
|---|---|---|
| 7,111,964 B2 * | 9/2006 | Suehiro et al. ............ 362/328 |
| 7,157,745 B2 * | 1/2007 | Blonder et al. ............ 257/98 |
| 2003/0209714 A1 * | 11/2003 | Taskar et al. ............ 257/79 |
| 2004/0136197 A1 | 7/2004 | Ishida |
| 2004/0211970 A1 * | 10/2004 | Hayashimoto et al. ...... 257/98 |
| 2004/0223338 A1 | 11/2004 | Koike et al. |
| 2004/0251469 A1 | 12/2004 | Yatsuda et al. |
| 2004/0257827 A1 | 12/2004 | Ishida et al. |
| 2005/0007025 A1 * | 1/2005 | Gauna ............ 315/149 |
| 2006/0071222 A1 | 4/2006 | Yatsuda et al. |

FOREIGN PATENT DOCUMENTS

| | | |
|---|---|---|
| JP | 10-190065 | 7/1998 |
| JP | 2000150968 | 5/2000 |
| JP | 2000-174350 A | 6/2000 |
| JP | 2001-127346 | 5/2001 |
| JP | 2001-196639 | 7/2001 |
| JP | 2001-210872 | 8/2001 |
| JP | 2001-345483 | 12/2001 |
| JP | 2002-50800 A | 2/2002 |
| JP | 2002-374006 A | 12/2002 |
| JP | 2003-503815 | 1/2003 |
| JP | 2003031007 | 1/2003 |
| JP | 2003-123517 A | 4/2003 |
| JP | 2004-056075 | 2/2004 |
| JP | 2004-95481 A | 3/2004 |
| JP | 2004-158293 A | 6/2004 |
| WO | 01/01037 | 1/2001 |

OTHER PUBLICATIONS

Japanese Office Action for Japanese Patent Application No. 2004-223707 dated Mar. 16, 2010.

Japanese Office Action for Japanese Patent Application No. 2004-223707 dated Aug. 31, 2010.

* cited by examiner

LED LAMP FOR LIGHT SOURCE OF
LIGHTING DEVICE

This application claims the priority benefit under 35 U.S.C. §119 of Japanese Patent Application No. 2004-223707 filed on Jul. 30, 2004, which is hereby incorporated by reference.

BACKGROUND OF THE INVENTION

1. Field of the Invention

The invention relates to an LED lamp. In particular, the invention relates to LED lamps for use in general applications, including vehicle lamps, street sign lamps, communication lamps, display lamps, etc. With regard to vehicle lamps, the invention relates to an LED lamp for a light source of a vehicle headlight which is used as an alternative to an incandescent lamp, a halogen lamp, or the like.

2. Description of the Related Art

FIG. 1 shows the configuration of a conventional headlight which uses an LED lamp as a light source. In this LED headlight lamp, LEDs are arranged in a matrix of three rows and eight columns to obtain prescribed brightness. A lens and the like are provided in front of the LEDs to obtain a desired light distribution characteristic. In the foregoing LED lamp, a plurality of chips may be enclosed (multi chip package) as necessary.

The LEDs with different colors are combined so that emission light is not tinted with a particular color. For example, the reference numeral 11 refers to LEDs emitting red light, reference numeral 12 refers to LEDs emitting green light, reference numeral 13 refers to LEDs emitting blue light, and reference numeral 14 refers to LEDs emitting yellow or white light (for example, see Translated Japanese Publication of International Application No. 2003-503815).

In the headlight having the conventional configuration described above, the plurality of LEDs, each of which has a beam-shaped light distribution characteristic, are combined to form the light distribution characteristic of the headlight. Thus, it is necessary to precisely align the orientation of the LEDs to even the light distribution characteristic of the individual LEDs. Accordingly, actual attachment requires high precision, and hence work operation becomes complicated and product yield is reduced. As a result, there is a problem in that costs are increased for the product.

When many LEDs are disposed in a large area, as described above, it is assumed that a necessary amount of light can be simply obtained as the total amount of light by calculation. It is difficult and almost impossible, however, to precisely orient light from the individual LEDs in a desired direction, so that it is also difficult or impossible to obtain a sufficient amount of light for brightly lighting up a distant location. Such an LED lighting device is available in signal lamps in accordance with current technology. As a lighting device such as a headlight, however, lighting at an attainable distance is insufficient even if the desired light distribution characteristic is obtained. Therefore, the LED lighting device is not commonly available in a headlight.

However, demand for a solid state light source is strong in recent years due to their low maintenance characteristics. Thus, it is desired to use LEDs as a light source in lamps, and particularly in a vehicle headlight.

SUMMARY OF THE INVENTION

In accordance with an aspect of the invention, an LED lamp can be utilized as a light source of a headlight. The headlight can reflect light by a reflecting mirror in a state as near to a filament as possible in order to brightly light up a distant place, in contrast to a conventional LED lamp.

As a concrete means for solving the foregoing and other conventional problems, another aspect of the invention includes providing an LED lamp for a light source of a lighting device having an LED chip. The emission surface of the LED lamp can be formed in a rectangular shape, and a ratio between a short side and a long side of the emission surface can be in a range of 1:2 to 1:6.

In the configuration according to this aspect of the invention, two to six of the LED chips may be aligned and mounted on a base, and each of the LED chips may be approximately in the shape of a square.

Alternatively, a single LED chip may be mounted on a base, and the ratio between a short side and a long side of the LED chip may be in a range of 1:2 to 1:6.

Alternatively, a cavity suitable for mounting the LED chip may be provided in a position of mounting the LED chip in a base, and the ratio between a short side and a long side of the cavity may be in a range of 1:2 to 1:6.

In the foregoing configuration, a transparent silicone resin can be charged into the cavity in which the LED chip is mounted, and a phosphor or other wavelength conversion type material can be mixed into the transparent silicone resin.

In the foregoing configuration, the transparent silicone resin charged into the cavity can include at least two types of silicone resins with different hardness, and the transparent silicone resin can be hierarchically charged so that the hardness is higher on the outside of the device.

In the foregoing configuration, the LED chip can be formed as a flip chip, and the surface of the flip chip can be covered with a phosphor.

According to another aspect of the invention, it is possible to obtain reflection light which satisfies prescribed light distribution characteristics, even when the LED lamp is used with an existing reflecting mirror for the headlight.

The ratio between the short side and the long side of the rectangular emission surface of the LED lamp can be set in the range of 1:2 to 1:6. Thus, the LED lamp is disposed in the vicinity of a focal point of the reflecting mirror in a paraboloid of revolution or the like, and light from the LED lamp is converted into parallel rays to form the light distribution characteristics prescribed for the headlight.

If a plurality of LED chips are used, light from the plurality of LED chips is not diffused into a large area. The light heads in the direction of a lens as parallel rays with a small area and high luminance, and passes through the lens. Accordingly, if a lens cut is formed in the lens to properly diffuse the light in a horizontal direction, it is possible to obtain the desired light distribution characteristics. Also, it is possible to obtain an epoch-making effect that the LED lamp can compose a headlight which can radiate a light beam with high luminance to a distant place.

BRIEF DESCRIPTION OF THE DRAWINGS

These and other features and advantages of the invention will become clear from the following description with reference to the accompanying drawings, wherein.

DETAILED DESCRIPTION OF PREFERRED EMBODIMENTS

Figure 1:
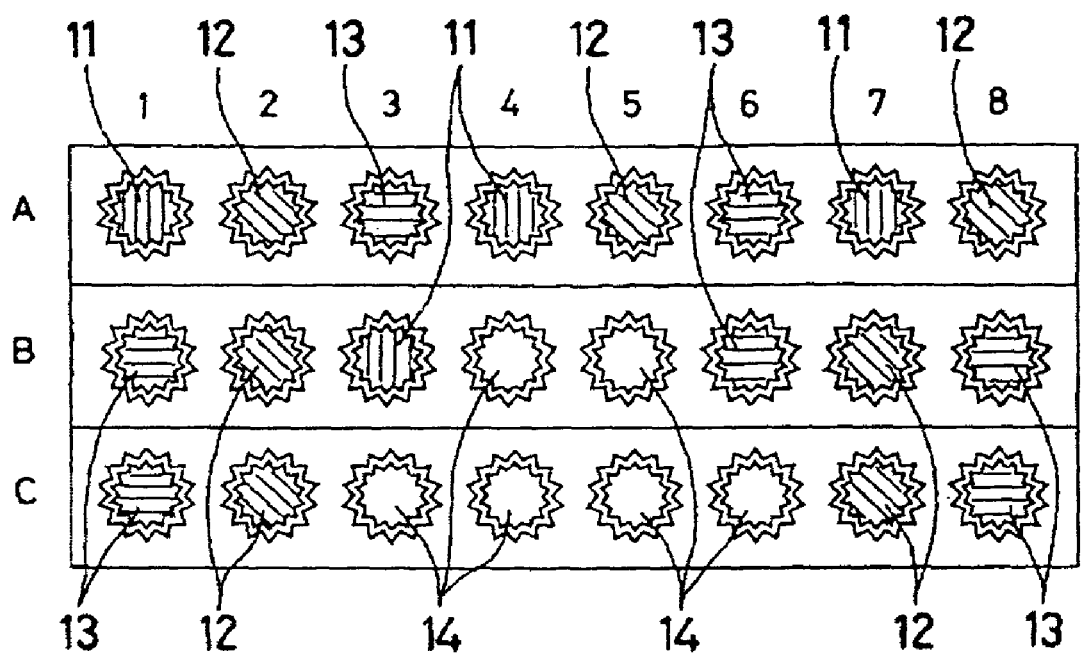
FIG. 1 is an explanatory view showing a conventional example.
Figure 2:
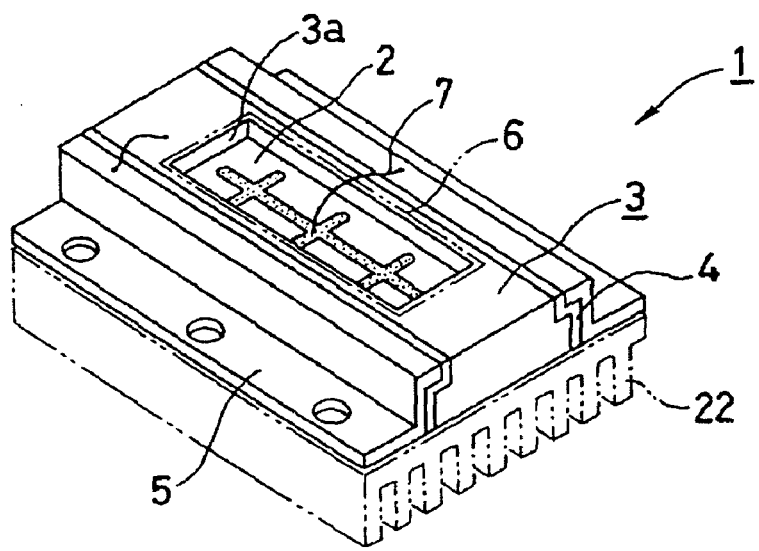
FIG. 2 is a perspective view showing an embodiment of an LED lamp for a light source of a lighting device made in accordance with the principles of the invention, in which a base is made of a metal.
Figure 3:
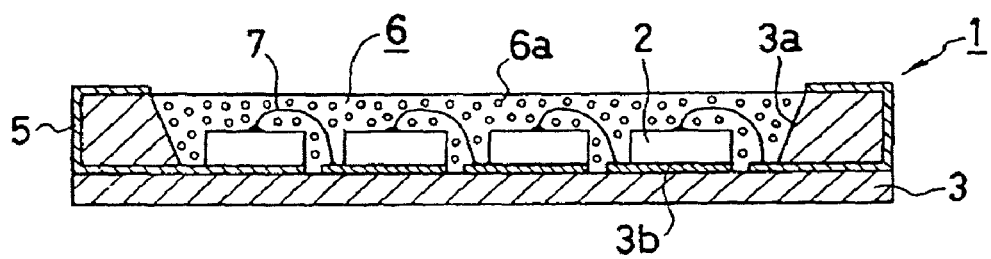
FIG. 3 is a sectional view showing another embodiment of an LED lamp for a light source of a lighting device made in accordance with the principles of the invention, in which a base is made of a ceramic.

The invention will be described in detail on the basis of exemplary embodiments shown in the drawings. Referring to FIGS. 2 and 3, the reference numeral 1 denotes an LED lamp for a light source of a lighting device according to two different embodiments of the invention. In both the embodiment shown in FIG. 2 and the embodiment shown in FIG. 3, the LED lamp 1 for the light source of the lighting device includes an LED chip 2, and a base 3 on which the LED chip 2 is mounted.

In the LED lamp 1, an electric current can be applied to the LED chip 2 (as much as possible), to obtain as much amount of light as possible. Accordingly, in this case, the base 3 on which the LED chip 2 is mounted should be made of a material being superior in heat conductivity, such as a metal like copper (refer to FIG. 2), a ceramic like AlN (aluminum nitride) (refer to FIG. 3), and the like. The thickness of the base 3 should be sufficient, if desired, for thermal diffusion after connecting with a heat sink 22 in its rear surface.

When the base 3 is made of a metal, insulating layers 4 can be provided in proper positions on both side faces of the base 3 as shown in FIG. 2, in order to insulate terminal boards 5 for feeding power to the LED chip 2 from the base 3. In the embodiments of FIG. 2 and FIG. 3, the base 3 has a recessed section (cavity) 3a. A transparent silicone resin 6, into which a phosphor 6a is mixed to obtain white light, can be injected and held in the recessed section (cavity) 3a to protect the mounted LED chip 2.

In the embodiment shown in FIG. 2, the ratio between a short side and a long side of the LED chip 2 is 1:3. The ratio between a short side and a long side of a rectangular emission surface can be limited to 1:2 to 1:6 in accordance with this embodiment, and the LED chip 2 which is formed into a rectangle having such a ratio may be used as shown in FIG. 2. Alternatively, as is described with reference to FIG. 3, a plurality of (for example, four) square LED chips may be aligned to substantially obtain the rectangular emission surface with such a ratio.

In the exemplary embodiment of FIG. 3, the base 3 is made of a ceramic such as AlN (aluminum nitride) or the like, and a plurality of (four in the drawing) square LED chips 2 are aligned. In a manufacturing method of this LED lamp 1, a wiring pattern 3b can be first printed on the base 3 with the use of a conductive coating material or the like, and the cavity 3a formed by laminating and firing a green sheet on the base 3. The terminal boards 5 can be formed concurrently with the formation of the cavity 3a. Power is applied from the outside through the terminal boards 5.

Then, a required number of LED chips 2 can be mounted on the wiring pattern 3b, and the LED chips 2 wired in series by gold wires 7. After that, the transparent silicone resin 6 including a proper amount of phosphor 6a mixed therein is injected into the cavity 3a. Thus, an exemplary embodiment of the LED lamp 1 for the light source of the lighting device made in accordance with the principles of the invention is completed. In the LED lamp 1 for the light source of the lighting device, the surface of the silicone resin injected into the cavity 3a can be approximately flush with the top face of the cavity 3a, so that the function of a lens does not substantially occur.

The four LED chips 2 are connected in series in FIG. 3, but the lighting voltage of the LED chip 2 can differ in accordance with difference in composition corresponding to its emission color. For example, the lighting voltage of a blue LED chip is approximately 3.6V. Also, there are cases where required minimum usable voltage differs in accordance with the type of vehicle.

Accordingly, in the LED lamp 1 for the light source of the lighting device as shown in FIG. 3, when working voltage is limited to 8 V to 9 V, for example, a pair of blue LED chips 2 is connected in series, and two pairs of the thus serially connected blue LED chips 2 are controlled by a constant current circuit in order to obtain a rectangular emission shape with an aspect ratio of 1:4. When a rectangular emission shape with an aspect ratio of 1:6 is required, on the other hand, three pairs of blue LED chips 2 can be used.

Upon turning on the LED lamp 1 for the light source of the lighting device formed as described above, blue light is emitted from the LED chips 2. This blue light becomes excitation light, and excites the mixed phosphor 6a when it passes through the silicone resin 6, so that yellow light is emitted from the phosphor 6a. Adjusting the mixture ratio of the phosphor 6a makes it possible to mix a blue emission color and a yellow emission color in a proper ratio, and hence it is possible to obtain white light proper for the lighting device, and in particular for a headlight.

Figure 4:
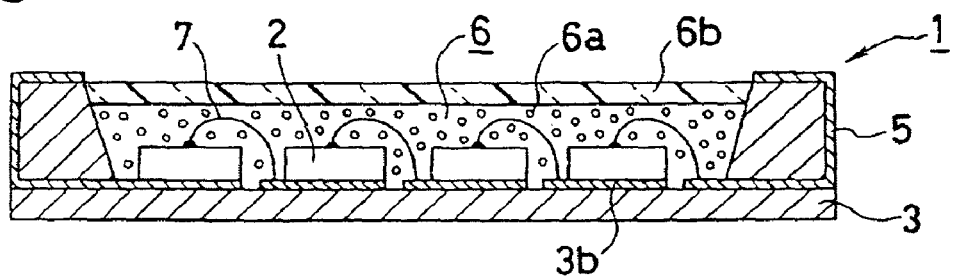
FIG. 4 is a sectional view showing another embodiment of an LED lamp for a light source of a lighting device made in accordance with the principles of the invention.

Since the transparent silicone resin 6 is soft and applies little stress to the LED chips 2 and the gold wires 7, the transparent silicone resin 6 is superior in its mechanical protective function. The transparent silicone resin 6, however, is inferior in the protective function for the LED chip 2 and the like with regard to being moisture proof, due to its hygroscopicity. In addition to this, when the soft transparent silicone resin 6 is employed, another problem such as the adhesion of foreign matter may occur because the surface thereof is adherent. To prevent these problems, as shown in FIG. 4, a film of a hard silicone resin 6b, which is harder than the soft silicone resin 6, may be provided over the transparent silicone resin 6, after the LED chips 2, the gold wires 7, and the like are covered with the soft transparent silicone resin 6, in order to prevent the adhesion of foreign matter or the like. In this case, the phosphor 6a or other wavelength conversion material may be mixed into the hard silicone resin 6b.

Figure 5:
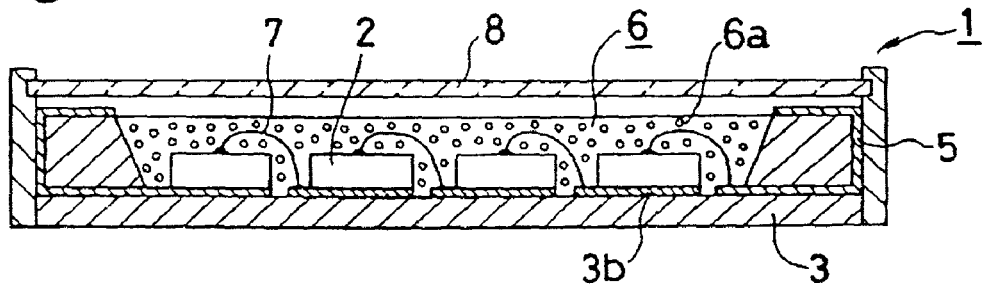
FIG. 5 is a sectional view showing another embodiment of an LED lamp for a light source of a lighting device made in accordance with the principles of the invention.

In an LED lamp 1 for a light source of a lighting device according to the embodiment shown in FIG. 5, a cover 8 is made of a transparent resin, transparent glass, or the like. The cover 8 is attached above a transparent silicone resin 6 (or a hard silicone resin 6b, though it is not illustrated). Accordingly, the problem of the adhesion of foreign matter is resolved, and the problem of hygroscopicity due to the adoption of silicone resin 6 is resolved at the same time. In the exemplary illustrated case, an air layer exists between the silicone resin 6 (or the hard silicone resin 6b) and the cover 8. Thus, there is a problem that approximately 5% of light is lost in a boundary surface having different refractive indexes.

Figure 6:
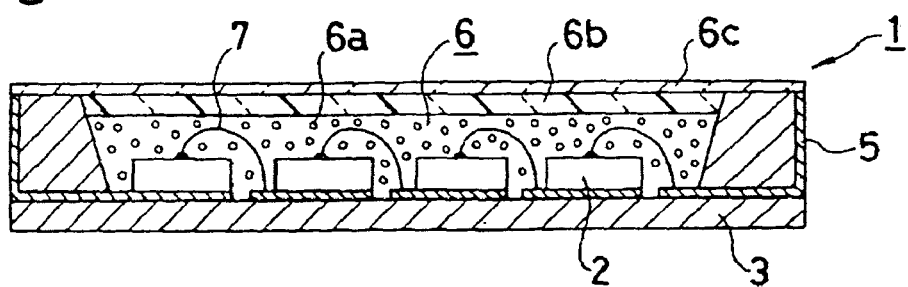
FIG. 6 is a sectional view showing another embodiment of an LED lamp for a light source of a lighting device made in accordance with the principles of the invention.

As shown in FIG. 6 as yet another embodiment of the invention, a $SiO_2$ (silicon dioxide) film 6c may tightly adhere so as to cover the top face of the hard silicone resin 6b shown in FIG. 4 (or the hard silicone resin 6b may not be provided). The film 6c can be used instead of the cover 8. Accordingly, it is possible to provide higher moisture-proofing, and to prevent the loss of the amount of light (approximately 5% per surface) due to the increase of boundary surfaces of air, when using the cover 8. Therefore, any of the foregoing configurations are available in accordance with desired performance.

Figure 7:
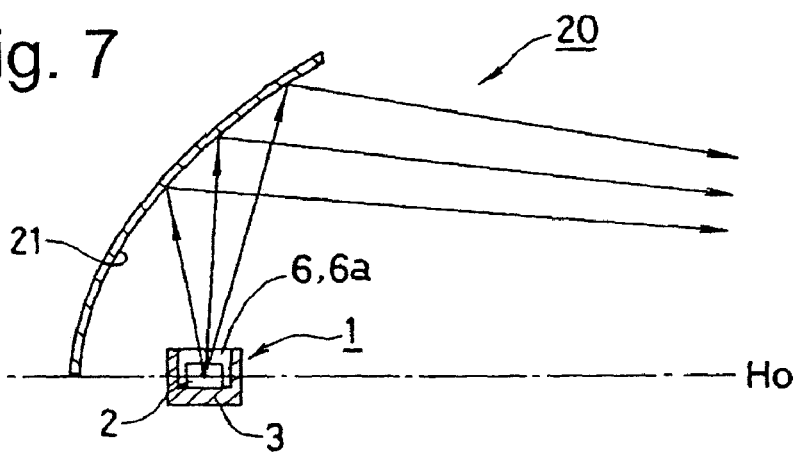
FIG. 7 is an explanatory view showing a state in which another embodiment of an LED lamp for the light source of the lighting device that is made in accordance with the principles of the invention is combined with a reflecting mirror.

FIG. 7 shows an embodiment of an LED lamp 1 installed in a headlight 20 and made in accordance with the principles of the invention. A reflecting mirror 21 formed as a paraboloid of revolution can be adopted in the headlight 20. The LED lamp 1 for the light source of the lighting device can be positioned properly in the vicinity of a focal point of the paraboloid of revolution. In this example, a longitudinal direction of the emission surface of the plurality of aligned LED chips 2 (for example, six) intersects with the center line Ho of the reflecting mirror 21. The reflecting mirror 21 being composed of the paraboloid of revolution in a horizontal forward direction (in the case where light is incident upon an upper half of the reflecting mirror 21).

Figure 8:
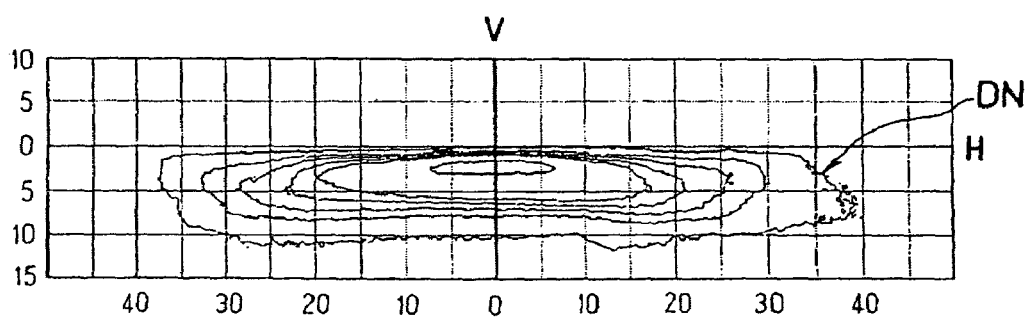
FIG. 8 is a diagram showing the light distribution characteristic of a headlight which adopts an LED lamp for the light source of the lighting device made in accordance with the principles of the invention.

According to this configuration, if light is incident upon the upper half of a reflector for reflection, as in the case of, for example, an irradiation state of a dipped-beam filament for an H4 type of halogen lamp, it is possible to obtain light distribution DN suitable for dipped light distribution for illuminating a horizontal line H or below (See FIG. 8). In the conventional dipped-beam filament halogen lamp, a hood is usually attached at a lower portion in advance, and half of the amount of light is lost prior to emission from the lamp. In the LED lamp 1 for the light source of the lighting device as shown in FIG. 7, light can be emitted to only the area of the upper half portion of the mirror from the beginning, so that the utilization ratio of luminous flux is significantly high.

Figure 9:
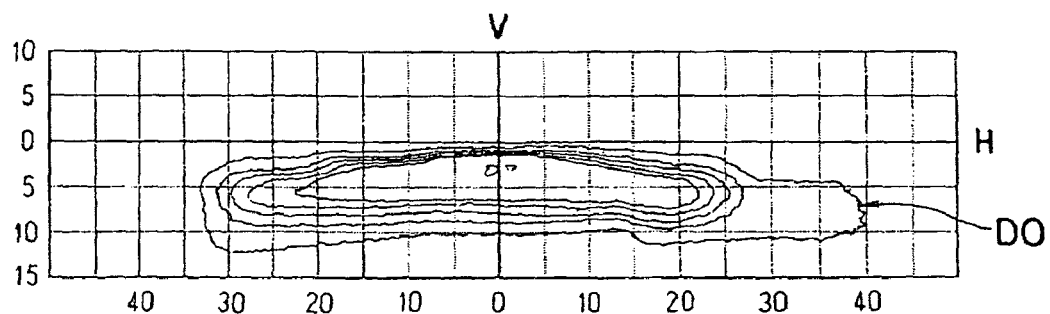
FIG. 9 is a diagram showing the light distribution characteristic of a headlight which adopts a conventional LED lamp, as a comparative example.

Furthermore, since the emission surface can be made rectangular, as in the embodiment of the invention shown in FIG. 7, an image of the light source projected by the reflector can be wide in a horizontal direction H and suitable for the light distribution of a lighting device for a vehicle. Thus, it is possible to easily obtain light distribution characteristics which are superior in horizontal view. As a comparative example, FIG. 9 shows light distribution characteristics DO, when the so-called dome type of single LED lamp is attached to an identical reflector. As is apparent from the distribution characteristics DO, the width of irradiation is narrow, and both end regions in the horizontal direction sag. Therefore, the comparative example is inferior in viewability.

Figure 10:
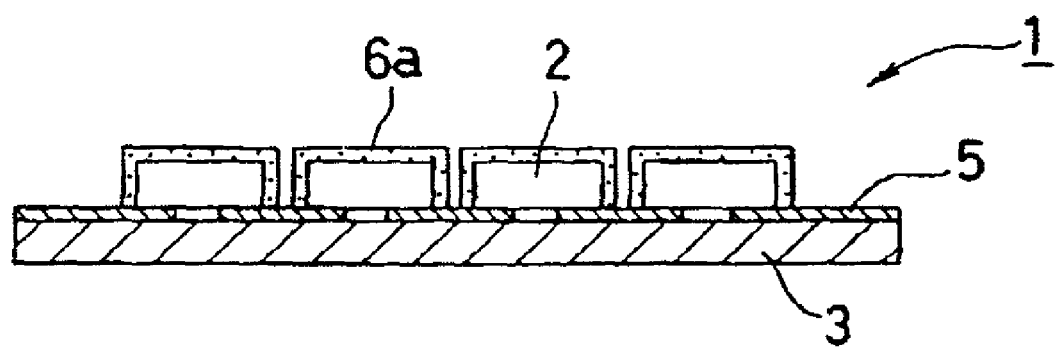
FIG. 10 is a sectional view of another embodiment of an LED lamp for a light source of a lighting device made in accordance with the principles of the invention.

FIG. 10 shows yet another embodiment of the invention. In any of the LED lamps 1 according to the embodiments of FIGS. 2-7, the LED chips 2 can be mounted in the cavity 3a provided in the base 3, and the transparent silicone resin 6 into which the phosphor 6a is mixed is charged into the cavity 3a. In such a configuration, the gold wire 7 is bonded to the top face of the chip 2, and the transparent silicone resin 6 protects the gold wire 7.

Accordingly, the size of the formed cavity 3a substantially becomes an emission area. Thus, the emission area becomes larger than the total emission area of the LED chips 2 themselves, and hence luminance may be reduced.

In the embodiment of FIG. 10, a flip chip is used as the LED chip 2. The LED chips 2 are mounted on a base 3, which has a flat top face and no cavity. The LED chips 2 protruding from the base 3 are coated with a wavelength conversion material, such as phosphor 6a. According to this configuration, it is possible to effectively use an emission surface including the phosphor 6a, and to obtain high luminance from a small area. The base 3 can also be thinned and miniaturized. Therefore, it is possible to miniaturize the whole headlight with the LED lamp 1 for the light source of the lighting device, and increase the luminance therefrom.

While there has been described what are at present considered to be preferred and exemplary embodiments of the invention, it will be understood that various modifications may be made thereto, and it is intended that the appended claims cover all such modifications as fall within the true spirit and scope of the invention.

What is claimed is:

1. An LED lamp for use as a light source of a vehicle lighting device, comprising:
    an LED light source consisting essentially of a single LED chip;
    a base including a cavity having a cavity short side, a cavity long side and a top face, wherein the LED chip is located in the cavity, a ratio between the cavity short side and the cavity long side is in a range of 1:2 to 1:6, an emission surface is defined by the cavity, the emission surface is a rectangular shape having a short side and a long side, and a ratio between the short side and the long side of the emission surface is in a range of 1:2 to 1:6;
    a transparent silicone resin formed on the single LED chip and filling the cavity in which the LED chip is located, the transparent silicone resin having a top surface;
    a wavelength conversion material mixed into the transparent silicone resin; and
    a reflecting mirror formed as a paraboloid of revolution having a center axis and a focal point, and located adjacent the LED light source and configured to reflect substantially all light directly emitted from the LED light source into a forward direction, wherein the cavity long side intersects with the center axis of the paraboloid of revolution in the vicinity of the focal point,
    wherein the top surface of the transparent silicone resin and the top face of the base form a substantially planar surface.

2. The LED lamp according to claim 1, further comprising at least one terminal board, wherein the base is a metal base, and an insulating layer is located between that at least one terminal board and the base.

3. The LED lamp according to claim 1, wherein the single LED chip includes a top surface, and one of a $SiO_2$ film and a glass cover is disposed over the top surface of the LED chip.

4. The LED lamp according to claim 1, wherein the transparent silicone resin includes a higher hardness transparent silicone resin and a relatively lower hardness transparent silicone resin, the higher hardness transparent silicone resin and the relatively lower hardness transparent silicone resin are in contact with each other with the lower hardness transparent silicone resin including a wavelength conversion material.

5. The LED lamp according to claim 1, wherein the transparent silicone resin includes at least two types of silicone resins with different hardnesses and wherein the higher hardness transparent silicone resin forms an outside surface that is exposed from the cavity.

6. The LED lamp according to claim 1, wherein a cover is formed over the transparent silicone resin and the cover and the transparent silicone resin are separated from each other to form a gap therebetween.

7. An LED lamp for use as a light source of a vehicle lighting device, comprising:
   a base including a cavity having a cavity short side, a cavity long side, and a top face, where a ratio between the cavity short side and the cavity long side is in a range of 1:2 to 1:6;
   at least one LED chip located in the cavity, wherein an emission surface is defined by the top face of the cavity, the emission surface is a rectangular shape having a surface short side and a surface long side, and a ratio between the surface short side and the surface long side is in a range of 1:2 to 1:6;
   a transparent silicone resin charged into the cavity and having a top surface, the transparent silicone resin including at least two types of silicone resins with different hardnesses, and a higher hardness transparent silicone resin forming an outside surface that is exposed from the cavity, wherein the at least one LED chip is mounted in the cavity by a bonding wire, and the at least one LED chip and the wire are enclosed by a low hardness transparent silicone resin; and
   a reflecting mirror formed as a paraboloid of revolution having a center axis and a focal point, and located adjacent the at least one LED chip and configured to reflect substantially all light directly emitted from the at least one LED chip into a forward direction, wherein the cavity long side intersects with the center axis of the paraboloid of revolution in the vicinity of the focal point, and
   wherein the top surface of the transparent silicone resin and the top face of the base form a substantially planar surface.

8. The LED lamp according to claim 7, further comprising: a wavelength conversion material mixed into the transparent silicone resin.

9. The LED lamp according to claim 8, wherein the wavelength conversion material is a phosphor.

10. The LED lamp according to claim 7, wherein the at least one LED chip is a flip chip, and a surface of the flip chip is covered with a phosphor.

11. The LED lamp according to claim 7, wherein the at least one LED chip includes two to six LED chips.

12. The LED lamp according to claim 7, wherein the at least one LED chip is mounted to the base.

13. The LED lamp according to claim 7, wherein one of a $SiO_2$ film and a glass cover is disposed over the top surface of the transparent silicone resin.

14. The LED lamp according to claim 7, wherein the higher hardness transparent silicone resin and the low hardness transparent silicone resin are in contact with each other with the low hardness transparent silicone resin including a wavelength conversion material.

15. An LED lamp for use as a light source of a vehicle lighting device, comprising:
   a base having a top face;
   an LED array comprising a plurality of flip-chip type LED chips located adjacent the base and having a long side and capable of emitting light, an emission area formed by light emitted from the plurality of flip-chip type LED chips, the emission area defined by a rectangular plane located in front of the plurality of LED chips and through which the emitted light intersects, the rectangular plane having a short side and a long side, wherein a ratio between the short side and the long side of the rectangular plane is in a range of 1:2 to 1:6, a portion of the plurality of flip-chip type LED chips being covered with a wavelength conversion material and forming a top surface; and
   a reflecting mirror formed as a paraboloid of revolution having a center axis and a focal point, and located adjacent the plurality of flip-chip type LED chips and configured to reflect substantially all light directly emitted from the plurality of flip-chip type LED chips into a forward direction, wherein the long side of the LED array intersects with center axis of the reflecting mirror in the vicinity of the focal point, and
   wherein the top surface of the wavelength conversion material and the top face of the base form a substantially planar surface.

16. The LED lamp according to claim 15, wherein the wavelength conversion material is a layer having a constant thickness.

17. The LED lamp according to claim 15, further comprising a flat cover forming an outside surface of the LED lamp, wherein the flat cover is made of at least one of silicone resin and glass.

* * * * *